United States Patent [19]
Tanaka et al.

[11] Patent Number: 6,097,560
[45] Date of Patent: *Aug. 1, 2000

[54] REPRODUCING APPARATUS HAVING CLOCK GENERATOR CONTROLLED BY DETECTED PHASE-DIFFERENCE AND TENDENCY OF PHASE-DIFFERENCE

[75] Inventors: Yasuyuki Tanaka, Tokyo; Shinichi Yamashita, Kanagawa-ken, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/512,801

[22] Filed: Aug. 9, 1995

[30] Foreign Application Priority Data

Aug. 25, 1994 [JP] Japan .................................. 6-200571

[51] Int. Cl.[7] ....................................................... G11B 5/09
[52] U.S. Cl. .............................. 360/51; 327/159; 375/376
[58] Field of Search ........................ 360/51, 64; 331/1 A, 331/16, 17, 20, 11; 386/19, 85, 88; 375/340, 373, 376, 327; 329/304, 308; 332/127; 327/159, 156

[56] References Cited

U.S. PATENT DOCUMENTS

| 4,037,095 | 7/1977 | Howells et al. ........................ 708/829 |
|---|---|---|
| 4,365,210 | 12/1982 | Harrington et al. .................. 360/51 X |
| 4,607,296 | 8/1986 | Smidth ...................................... 360/51 |
| 4,942,370 | 7/1990 | Shigemori ................................ 331/1 A |
| 5,157,355 | 10/1992 | Shikakura et al. ........................ 331/11 |
| 5,207,491 | 5/1993 | Rottinghaus .......................... 331/17 X |
| 5,465,277 | 11/1995 | Schreurs et al. ........................ 375/376 |
| 5,546,032 | 8/1996 | Yatagai .................................... 327/165 |
| 5,677,802 | 10/1997 | Saiki et al. ................................ 360/51 |
| 5,774,290 | 6/1998 | Sasaki et al. ............................. 360/51 |

*Primary Examiner*—Aristotelis M. Psitos
*Assistant Examiner*—Dan Davidson
*Attorney, Agent, or Firm*—Robin, Blecker & Daley

[57] ABSTRACT

An apparatus for generating a clock signal phase-synchronized with an input signal includes phase-difference detecting circuitry for detecting a phase difference between an input signal and a clock signal phase-synchronized with the input signal, detecting circuitry for detecting a tendency of an output of the phase-difference detecting circuitry and outputting a signal indicative of the tendency, and adder for adding together an output of the detecting means and the output of the phase-difference detecting circuitry, and an oscillator for receiving an output of the adder and outputting as the clock signal a signal having a frequency corresponding to the output of the adder.

26 Claims, 9 Drawing Sheets

REPRODUCING APPARATUS HAVING CLOCK GENERATOR CONTROLLED BY DETECTED PHASE-DIFFERENCE AND TENDENCY OF PHASE-DIFFERENCE

BACKGROUND OF THE INVENTION

1. Field of the Invention

The present invention relates to a reproducing apparatus and, more particularly, to an apparatus for reproducing a clock signal from a digital signal reproduced from a recording medium.

2. Description of the Related Art

It has heretofore been known that a phase-locked loop (hereinafter referred to as "PLL") is used to extract a clock signal phase-synchronized with a reproduced signal, from a received data train in an apparatus, such as a digital VTR, which transmits (records and reproduces) data at high speed.

Figure 1:
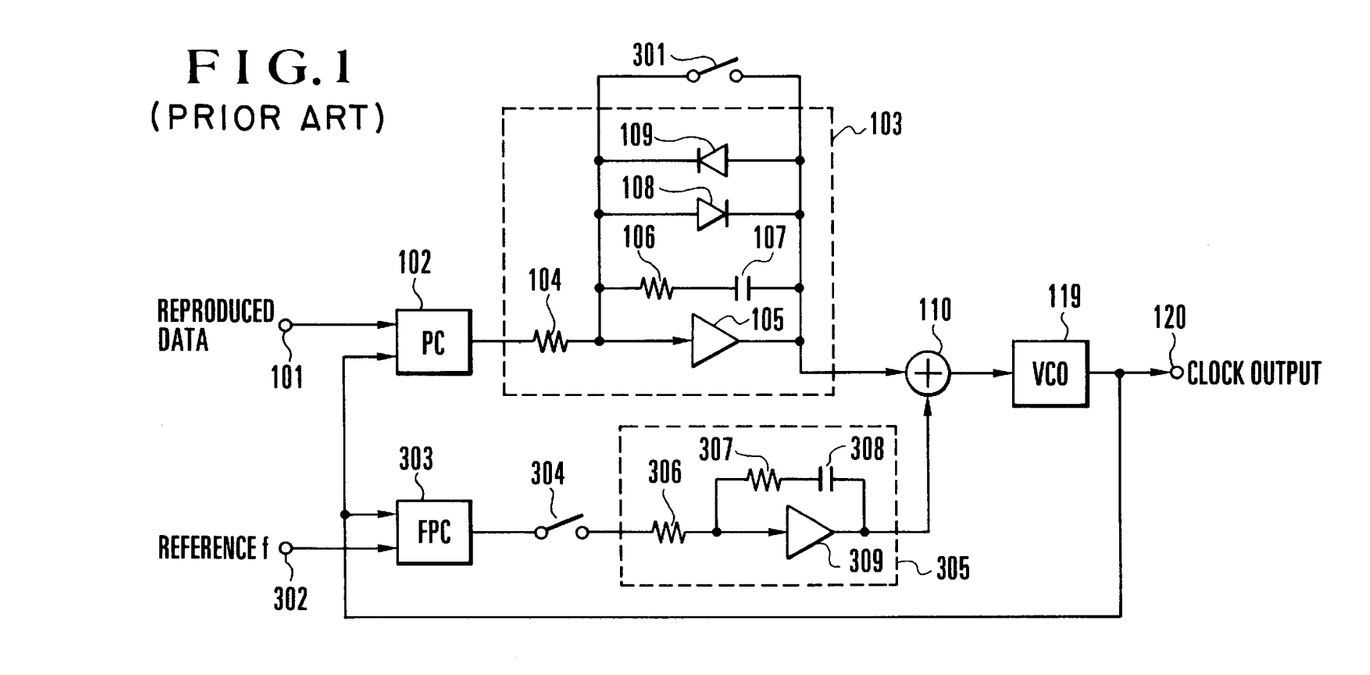
FIG. 1 is an explanatory view of a related art.

A circuit of the type shown in FIG. 1 is used as a circuit for generating such a clock signal from a digital signal reproduced from a recording medium.

Referring to FIG. 1, a digital signal reproduced from a recording medium (not shown) is amplified by an amplifier and equalized by an equalizer (not shown), and the reproduced digital signal outputted from the equalizer is applied to one input of a phase comparing circuit 102 via an input terminal 101.

The output of a voltage controlled oscillator (VCO) 119 which will be described later is applied to the other input of the phase comparing circuit 102.

The phase comparing circuit 102 generates a signal having a voltage proportional to the phase difference between the two input signals, and outputs the signal to a loop filter 103. The loop filter 103 is made up of resistances 104 and 106, an amplifier 105, a capacitor 107 and diodes 108 and 109 which function to limit their respective output voltages within ±0.7 V. The loop filter 103 suppresses the high-frequency component of the input signal and applies the resultant signal to one input of an adder 110. A switch 301 is connected across the input and output terminals of the amplifier 105.

In the meantime, a reference signal having a frequency approximately equal to the center frequency of a clock signal extracted from the reproduced digital signal which contains jitter is applied to the input terminal 302 from an oscillator (not shown), and the reference signal is applied to one input of a frequency/phase comparing circuit (hereinafter referred to as "FPC") 303. The output of the VCO 119 is applied to the other input of the FPC 303. The FPC 303 compares the frequency and phase of the reference signal with those of the output of the VCO 119, respectively, and outputs the comparison result to a switch 304. Incidentally, the FPC 303 may be, for example, Motorola's MC12040.

The switch 304 is closed at a timing which will be described later, and when the switch 304 is closed, the output of the FPC 303 is applied to a loop filter 305. The loop filter 305 is made up of an amplifier 309, resistances 306 and 307 and a capacitor 308, and the output signal of the loop filter 305 is applied to the other input of the adder 110.

The adder 110 adds together the voltages of the two input signals, and outputs the sum to the VCO 119.

The circuit shown in FIG. 1 has a state (mode A) in which the phase is made coincident with that of the reproduced signal applied to the input terminal 101 and a state (mode B) in which the frequency and the phase are made coincident with those of the reference signal applied to the input terminal 302. If the switches 301 and 304 are open, the circuit selects the mode A, whereas if they are closed, the circuit selects the mode B.

When the circuit is in the mode A, a phase-locked loop (hereinafter referred to as "PLL") is formed. In the PLL, a phase error between the output signal of the VCO 119 and the reproduced signal applied to the input terminal 101 is inputted to the loop filter 103, and the loop filter 103 averages the input phase error and outputs to the VCO 119 a signal having a voltage capable of cancelling the phase error between the output signal of the VCO 119 and the reproduced signal. During the mode A, since the switch 304 is open, the output of the amplifier 309 is maintained at a constant voltage.

When the circuit is in the mode B, a feedback loop is formed. In the feedback loop, the FPC 303 compares the reference signal inputted through the input terminal 302 with the output signal of the VCO 119 and inputs a signal indicative of the obtained error to the loop filter 305. The loop filter 305 averages the output signal of the FPC 303 and outputs to the VCO 119 through adder 110 a signal having a voltage capable of reducing the error. During the mode B, since the switch 301 is closed, the output of the amplifier 105 is held at zero.

Figure 2:
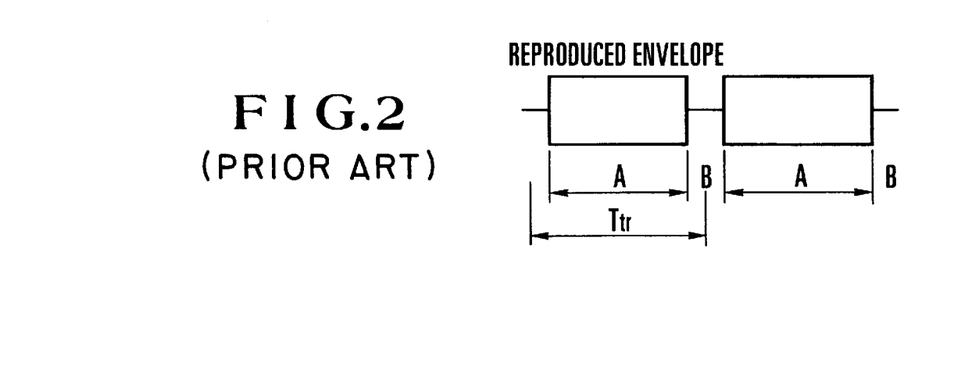
FIG. 2 is a view aiding in explaining the operation of the circuit shown in FIG. 1.

FIG. 2 shows the timing of switching between the mode A and the mode B. The waveform shown in FIG. 2 is an example of a reproduced envelope. During the time period in which an envelope is present, the mode A is selected and the PLL is operated by employing the reproduced signal, thereby producing a clock signal. During the time period in which no envelope is present, since phase lock based on the reproduced signal is impossible, the mode B is selected and the oscillation frequency of the VCO 119 is made approximately coincident with a frequency to which the PLL is to be locked when the next envelope is obtained.

According to such an arrangement, even if the oscillation frequency of the VCO 119 varies with a temperature variation or the like, the mode B is selected so that the frequency of the VCO 119 can be held approximately in the center of the lock range of the PLL at all times.

However, the above-described conventional example requires a multiplicity of analog constituent components such as an FPC and an oscillator for generating a reference signal. This leads to a number of problems such as an increase in the size of the whole circuit, an increase in the price of the apparatus, and the inferior reliability of the analog circuit.

In addition, the conventional example, which is incapable of reproducing data during the mode B, cannot be applied to a case in which continuous data is needed.

SUMMARY OF THE INVENTION

It is, therefore, an object of the present invention to solve the above-described problems.

Another object of the present invention is to provide an apparatus capable of stably generating a clock signal without being influenced by a temperature variation or aging, by holding the PLL in the center of the lock range thereof at all times.

To achieve the above objects, in accordance with the present invention, there is provided an apparatus for generating a clock signal phase-synchronized with an input signal, which apparatus comprises phase-difference detecting means for detecting a phase difference between an input signal and a clock signal phase-synchronized with the input signal, detecting means for detecting a tendency of an output of the phase-difference detecting means and outputting a signal indicative of the tendency, adding means for adding together an output of the detecting means and the output of the phase-difference detecting means, and oscillation means for receiving an output of the adding means and outputting as the clock signal a signal having a frequency corresponding to the output of the adding means.

Another object of the present invention is to provide an apparatus which is inexpensive and made up of a reduced number of constituent components and which is capable of stably generating a clock signal.

The above and other objects, features and advantages of the present invention will become apparent from the following detailed description of preferred embodiments of the present invention, taken in conjunction with the accompanying drawings.

DETAILED DESCRIPTION OF THE PREFERRED EMBODIMENTS

Preferred embodiments of the present invention will be described below with reference to the accompanying drawings.

Figure 3:
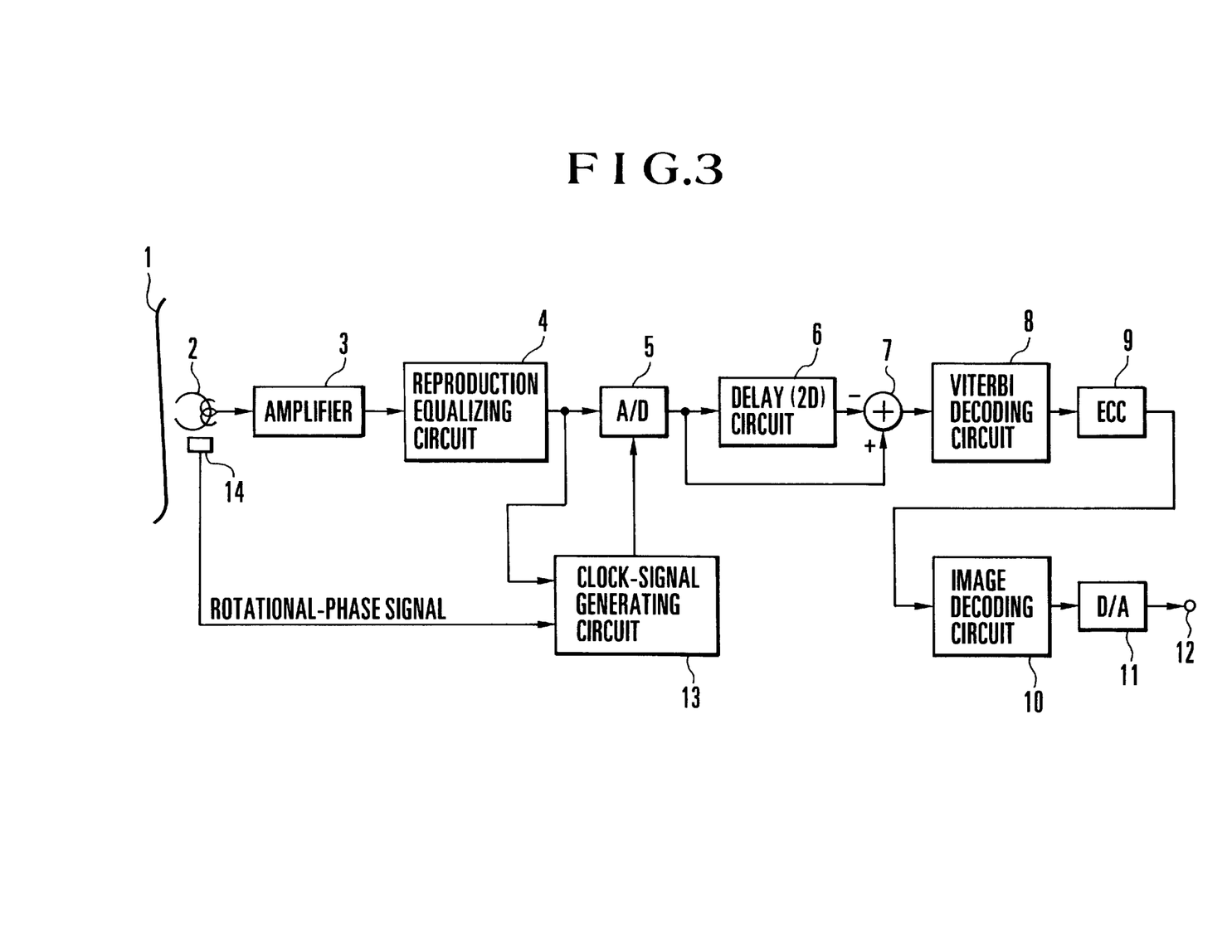
FIG. 3 is a block diagram showing the arrangement of a digital VTR according to a first embodiment of the present invention.

In the description of a first embodiment, reference will be made to an example in which the present invention is applied to a digital VTR. FIG. 3 is a block diagram schematically showing the arrangement of the reproducing system of the digital VTR.

In the arrangement shown in FIG. 3, a digital signal recorded on a magnetic tape 1 is reproduced by a rotary magnetic head 2, and the reproduced digital signal is amplified by an amplifier 3 and outputted to a reproduction equalizing circuit 4. Although the digital VTR according to the first embodiment is arranged to record a video signal for one frame on ten tracks, another arrangement may, of course, be adopted.

The reproduction equalizing circuit 4 is an equalizing circuit for compensating for variations in the characteristics of signals occurring in a magnetic recording/reproducing system, and performs so-called integral equalization. The reproduced signal equalized by the reproduction equalizing circuit 4 is outputted to both an A/D converter 5 and a clock-signal generating circuit 13.

The clock-signal generating circuit 13 serves to generate not only a clock signal for use in the A/D converter 5, but also operation clock signals for use in individual parts of the apparatus. The operation of the clock-signal generating circuit 13 will be described later in detail.

The A/D converter 5 performs sampling to convert the equalized reproduced signal into a digital-signal, and outputs the digital signal to a delay circuit 6. The delay circuit 6 delays the digital signal by the period of two clock signals, and a subtracter 7 subtracts the delayed digital signal from the original digital signal.

The process of converting the reproduced digital signal into the digital signal by the A/D converter 5 will be described below more specifically. The reproduced signal supplied from the amplifier 3 is an analog signal, i.e., its amplitude is variable with time, which has digital content. The analog signal is the digital signal having such an amplitude of analog form is converted into a digital signal consisting of a plurality of bits per sample by the A/D converter 5, and this digital signal is restored to a signal of one bit per sample represented by two values of "1" and "0", by a Viterbi decoding circuit 8 which is provided at the rear stage of the subtracter 7.

The reproduced signal waveform equalized by the reproduction equalizing circuit 4 through the integral equalization is converted into a waveform having a partial response (hereinafter referred to as "PR") (1, 0, −1) characteristic through the aforesaid subtraction, and this waveform is subjected to maximum Likelihood decoding by the Viterbi decoding circuit 8.

The combination of PR (1, 0, −1) techniques and Viterbi decoding is widely used in digital VTRS, etc., which employ high-density magnetic recording, because it is possible to minimize transmission error by compensating for the disadvantages (a degradation in S/N ratio, a waveform distortion, etc.) of the low-frequency-characteristics of a magnetic recording system.

The reproduced data restored by the Viterbi decoding circuit 8 is supplied to an error correcting circuit (ECC circuit) 9, in which the error which has occurred in the reproduced data on a transmission path is corrected by employing the parity data added to the data during recording. The thus-corrected reproduced data is outputted to an image decoding circuit 10. The image decoding circuit 10 expands the amount of information of the reproduced data compressed during recording, and outputs the expanded reproduced data to a D/A converter 11. The D/A converter 11 converts the input digital data into analog data, and outputs the analog data through an output terminal 12.

A rotational-phase detecting circuit 14 is provided for generating a rotational-phase signal synchronized with the rotational phase of the rotary magnetic head 2.

The clock-signal generating circuit 13 shown in FIG. 3 will be described below.

Figure 4:
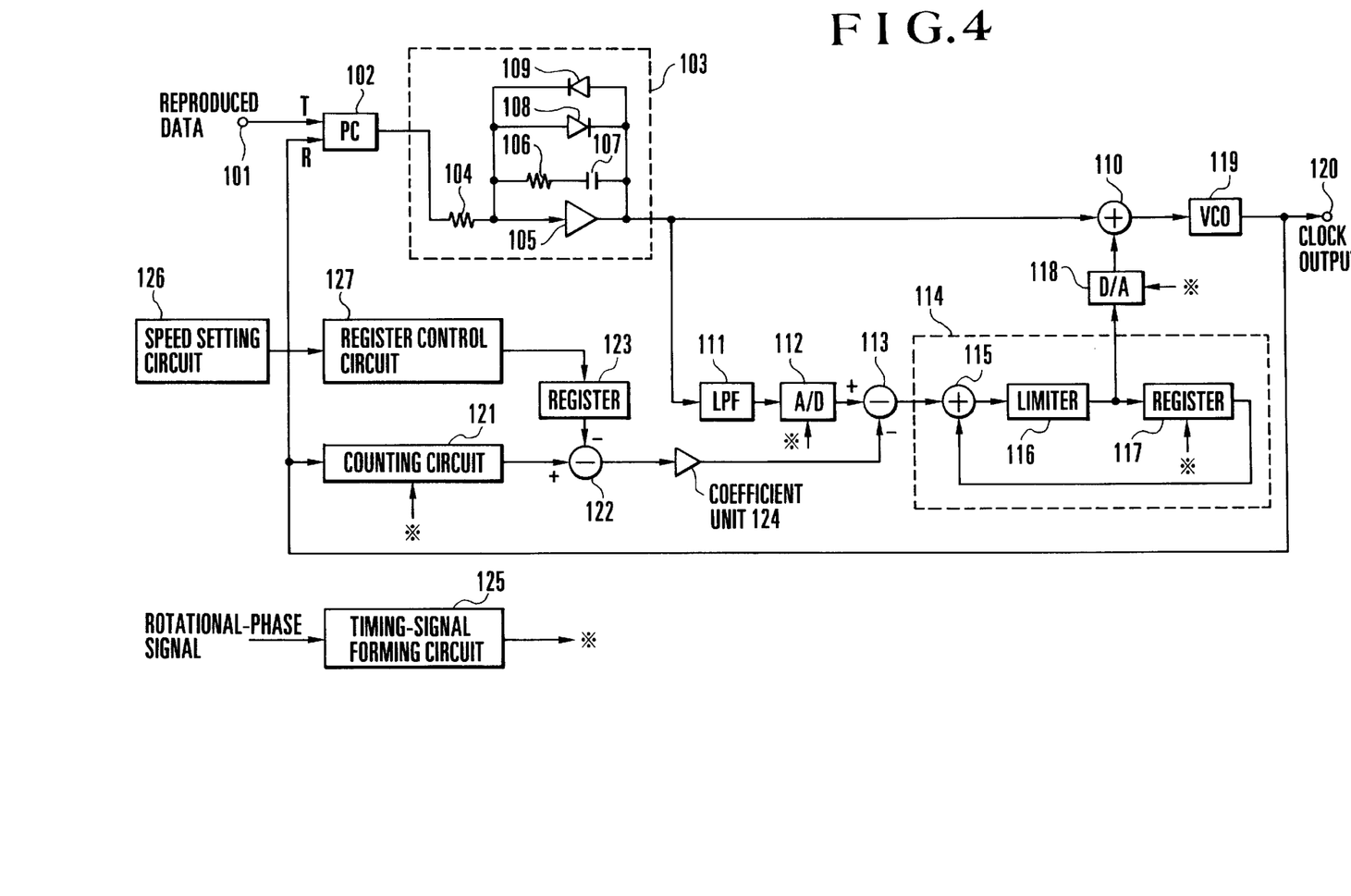
FIG. 4 is a block diagram showing the arrangement of the clock-signal generating circuit shown in FIG. 3.

FIG. 4 is a block diagram showing an example of the arrangement of the clock-signal generating circuit 13.

The clock-signal generating circuit 13 shown in FIG. 4 is provided with a PLL loop similar to that used in the above-described related art. In the PLL loop, the phase error between a VCO 119 and the reproduced signal inputted through an input terminal 101 is inputted to a loop filter 103, and the input phase error is averaged so that a signal having a voltage capable of cancelling the phase error between the VCO 119 and the reproduced signal is inputted to the VCO 119.

The feature of the first embodiment will be described below.

The output of the VCO 119 which is oscillated in the above-described manner is inputted to a counting circuit 121. The counting circuit 121 counts the number of waveforms of the output signal of the VCO 119 within a certain time period, for example, a time period which corresponds to the period required for the aforesaid rotary magnetic head 2 to trace one track (this time period is hereinafter referred to as "Ttr", and Ttr in this embodiment is 1/300 second). The counting circuit 121 outputs the result to a positive input terminal of a digital subtracter 122. The output of a register 123 is supplied to a negative input terminal of the digital subtracter 122.

At this time, a value given by fcent×Ttr is set in the register 123, where fcent is the center frequency of a clock signal extracted from a reproduced digital signal which contains jitter. Accordingly, if the VCO 119 is oscillating at the frequency fcent, the output of the digital subtracter 122 is zero.

The output of the digital subtracter 122 is level-adjusted by a coefficient unit 124, as will be described later, and the output of the coefficient unit 124 is inputted to a negative input terminal of a digital subtracter 113.

The output of the loop filter 103 is outputted to an adder 110, as described above, and to a low-pass filter (hereinafter referred to as "LPF") 111. The A/D converter 112 converts the output of the LPF 111 into a digital signal, for example, at the timing shown at Ttr in FIG. 5. The timing signal of this Ttr is formed by a timing-signal forming circuit 125 on the basis of the rotational-phase signal outputted from the rotational-phase detecting circuit 14, and is outputted from the timing-signal forming circuit 125 to the counting circuit 121, the A/D converter 112, a register 117 and a D/A converter 118.

The LPF 111 serves as a pre-filter for A/D conversion to be performed by the A/D converter 112, and the output of the A/D converter 112 is applied to a positive input terminal of the subtracter 113.

The subtracter 113 subtracts the output of the coefficient unit 124 from the output of the A/D converter 112 and outputs the result to an integrator 114.

The integrator 114 is made up of an adder 115, a limiter 116 and the register 117. So long as the output value of the adder 115 does not reach an upper or lower limit value, each time a clock signal is inputted to the register 117, the clock signal is added to the value inputted from the subtracter 113.

The output of the integrator 114 is converted into an analog signal by the D/A converter 118, and the analog signal is outputted to the adder 110.

The operation of generating a clock signal in the first embodiment will be described below.

Figure 5:
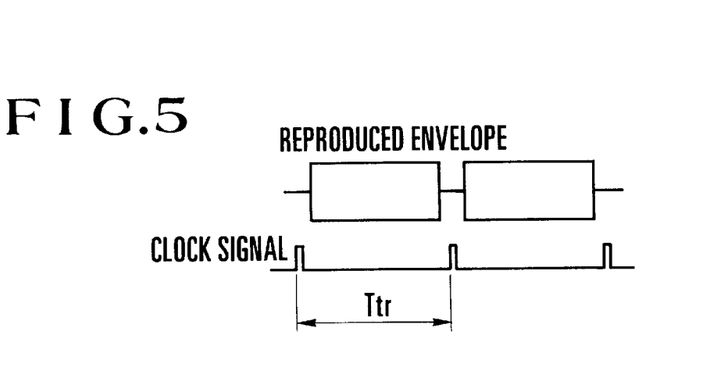
FIG. 5 is a timing chart aiding in explaining the operation of the circuit shown in FIG. 3.

In the clock-signal generating circuit 13 shown in FIG. 4, a portion for producing the reproduced envelope shown in FIG. 5 constitutes the PLL in which the phase of the reproduced signal and the phase of the output signal of the VCO 119 are compared with each other by the phase comparing circuit 102 and the comparison result is averaged by the loop filter 103 and applied to the VCO 119 via the adder 110. The oscillation output signal of the VCO 119 is outputted from an output terminal 120 as a clock signal for use in the A/D converter 5.

The following description is made in connection with a case in which the oscillation frequency of the VCO 119 tends to lower by any external cause when the PLL formed by the phase comparing circuit 102, the loop filter 103 and the VCO 119 is phase-locked during the time period Ttr in which the reproduced envelope is obtained. In this case, since a phase difference occurs between the input signals of the phase comparing circuit 102 during the time period Ttr in which the reproduced envelope is obtained, the output voltage of the phase comparing circuit 102 decreases and the output voltage of the loop filter 103 increases. Then, control is performed so that the output clock signal of the VCO 119 and the reproduced clock signal can be placed in correct phase with each other.

In this manner, the phase error between the output clock signal of the VCO 119 and the reproduced clock signal due to the error of the oscillation frequency of the VCO 119 is corrected. However, in this corrected state, the output of the loop filter 103 has already increased and the output has deviated from the center of the lock range of the PLL. Accordingly, if the phase error between the reproduced clock signal and the output clock signal of the VCO 119 is to be further corrected, the lock of the PLL will become unable to follow phase variations.

To solve this problem, the first embodiment is arranged to detect the phase error with a time constant which is long compared to the PLL, through the path of the LPF 111→the A/D converter 112→the integrator 114→the D/A converter 118→the adder 110, thereby detecting the tendency of the output voltage of the loop filter 103 and adding the detected tendency to the output voltage of the loop filter 103. Thus, the deviation of the output of the loop filter 103 is compensated for by using the output of the D/A converter 118, whereby the output of the loop filter 103 is held in the center of the lock range of the PLL at all times. This operation of the first embodiment will be described below.

Since the A/D converter 112 operates at the timing of Ttr, i.e., at 300 Hz, as described above, the cut-off frequency of the LPF 111 is 150 Hz and the response speed is very low. Therefore, even during the time period in which no reproduced envelope is obtained, the output of the LPF 111 does not vary to a substantial extent, so that the output of the A/D converter 112 increases accordingly as the output of the loop filter 103 increases, as described above, owing to the phase error between the output clock signal of the VCO 119 and the reproduced clock signal.

Therefore, the value of the register 117 within the integrator 114 varies in the positive direction, so that the output of the D/A converter 118 increases. Since the output of the D/A converter 118 is equal to the error signal outputted from the loop filter 103 during the time period Ttr, the output of the D/A converter 118 can be substituted for the error signal outputted from the loop filter 103. Accordingly, since control is performed not in accordance with an increase in the output voltage of the loop filter 103 but by using the output of the D/A converter 118, it is possible to hold the output voltage of the loop filter 103 in the center of the lock range of the PLL at all times.

As the output of the adder 110 increases, the oscillation frequency of the VCO 119 becomes higher as described above. When the phase difference between the reproduced clock signal and the output clock signal of the VCO 119 is cancelled, the variation in the value of register 117 disappears. In the meantime, since the oscillation frequency of the VCO 119 does not vary, no error signal is outputted from the digital subtracter 122, so that the output of the A/D converter 112 is outputted from the subtracter 113 without modification.

The reason why the operating clock signal of each of the counting circuit 121, the A/D converter 112, the register 117 and the D/A converter 118 is set to Ttr in time, i.e., 300 Hz in frequency, is to add the output of the D/A converter 118 to the output of the loop filter 103 at the adder 110 during the time period in which no reproduced envelope is obtained, thereby preventing disturbance of the PLL due to an instantaneous variation in the input voltage of the VCO 119 during the time period in which the reproduced signal is obtained.

Also, in a case where the reproduced envelope is obtained at all times, if the clock-signal generating circuit 13 is made to operate when a signal other than an effective signal (for example, an image signal or a sound signal) is being reproduced, it is possible to minimize the disturbance of an image or sound due to frequency variations.

Frequency control using the counting circuit 121 and the register 123 will be described below. This system to be described below is used so that, if the frequency of a signal reproduced from the magnetic tape 1 varies due to search reproduction or other special reproduction, the center frequency of the VCO 119 can be made to vary by varying the values of the register 123.

During special reproduction such as high-speed search reproduction or reverse search reproduction, since the relative speed between the magnetic tape 1 and the rotary magnetic head 2 varies, the frequency of the reproduced signal also varies compared to normal reproduction. Accordingly, the frequency of the clock signal to be generated by the clock-signal generating circuit 13 must be varied.

Specifically, a speed setting circuit 126 outputs a signal indicative of the running speed of the magnetic tape 1 to a register control circuit 127. The register control circuit 127 determines a value corresponding to a variation in the frequency of the reproduced signal, according to the input tape running speed, and writes the value into the register 123.

In the clock-signal generating circuit 13 shown in FIG. 4, a feedback loop is formed as described previously. In the feedback loop, the counting circuit 121 counts the clock signal outputted from the VCO 119 during the time period Ttr, and outputs the count value at the timing when the timing signal Ttr is inputted. The digital subtracter 122 subtracts the count value from the output of the register 123, and the output of the digital subtracter 122 is supplied to the integrator 114 via the coefficient unit 124 and the digital subtracter 113, and the output of the digital subtracter 122 is averaged by the integrator 114. The output of the integrator 122 is supplied to the adder 110 via the D/A converter 118, and the output of the adder 110 is supplied to the VCO 119. In other words, automatic control of the oscillation frequency of the VCO 119, i.e., an AFC operation, is performed by the above-described feedback loop.

The gain of the coefficient unit 124 is set to be kept equal between the output of the loop filter 103 and the input of the subtracter 113, so that it is possible to prevent the influence of phase or frequency variations from being exerted on the integrator 114.

The gain of the coefficient unit 124 is set so that the path of the loop filter 103→the adder 110→the VCO 119→the counting circuit 121→the digital subtracter 122→the coefficient unit 124 can be equal to the path of the loop filter 103→the LPF 111→the A/D converter 112.

As described above, in the first embodiment, during the time period Ttr, normal phase control is performed by the PLL formed by the phase comparing circuit 102, the loop filter 103, the adder 110 and the VCO 119, to produce a clock signal. In addition, by operating the feedback loop formed by the LPF 111, the A/D converter 112, the integrator 114, the D/A converter 118, the adder 110 and the VCO 119 at intervals of the time period Ttr, the tendency of the output of the loop filter 103 is detected to compensate for the deviation of the output voltage of the loop filter 103 (the input voltage of the VCO 119) due to a phase error occurring during the time period Ttr. Thus, it is possible to hold the output voltage of the loop filter 103 in the center of the lock range of the PLL at all times. Accordingly, it is possible to prevent the lock of the PLL from readily becoming unable to follow a variation in the oscillation frequency of the VCO 119.

In addition, it is not necessary to incorporate an analog constituent component, such as an FPC or an oscillator for generating a reference signal In addition, the counting circuit 121 counts the clock output of the VCO 119, and the output of the register 123 is subtracted from the count value to detect the error of the oscillation frequency of the VCO 119 which occurs during the time period Ttr. The digital subtracter 113 subtracts the detected error from the output of the loop filter 103, and the output of the digital subtracter 113 is integrated to obtain an average value of the frequency error, and the oscillation frequency of the VCO 119 is controlled on the basis of the average value. Accordingly, it is possible to prevent the oscillation frequency of the VCO 119 from varying due to temperature variations or aging.

In addition, since the value of the register 123 is varied according to the transport speed (reproduction speed) of the magnetic tape 1, it is possible to generate a clock signal having an optimum frequency corresponding to each reproduction mode even during special reproduction such as high-speed search reproduction.

Although in the first embodiment the output voltage of the loop filter 103 is averaged by the LPF 111 and the result provided by the subtracter 113 is integrated by the integrator 114 to detect the tendency of the output of the loop filter 103, it is also possible to detect such tendency, as by counting the most significant bit (MSB) of the output data of the A/D converter 112 by means of an up-down counter. Another method can also be employed.

A second embodiment of the present invention will be described below.

Figure 6:
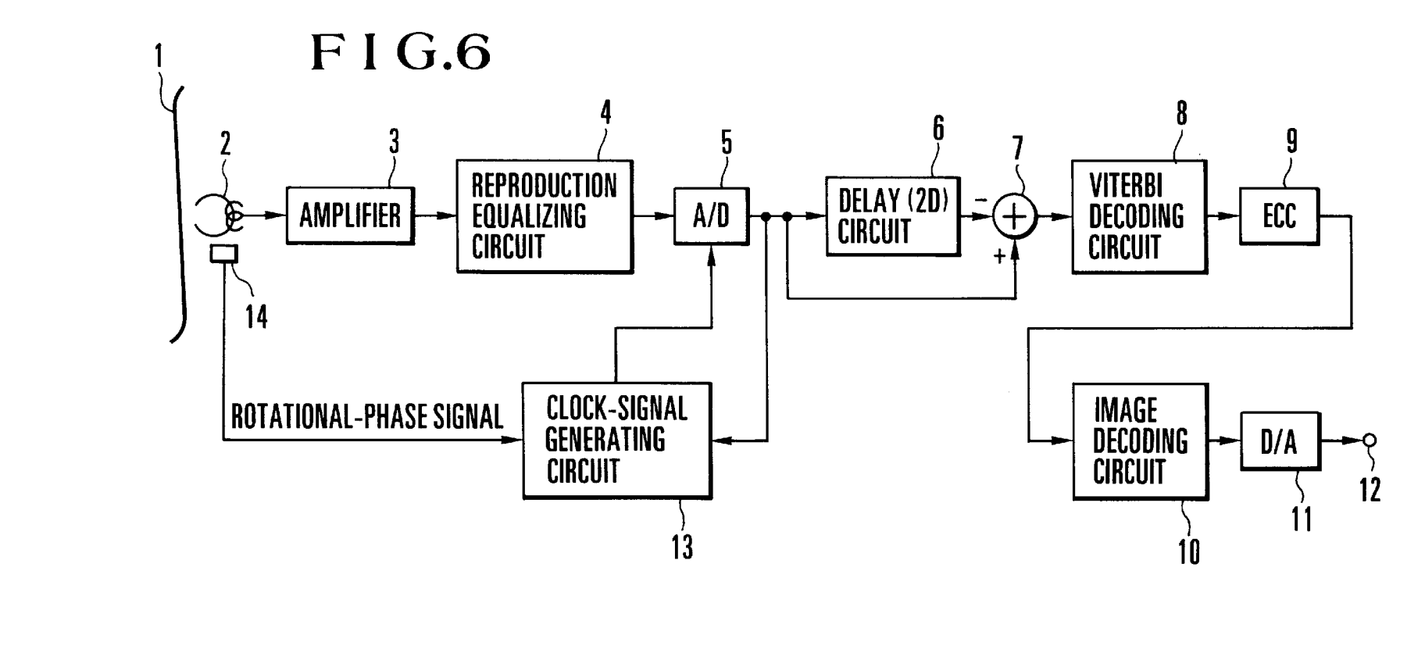
FIG. 6 is a block diagram showing the arrangement of a digital VTR according to a second embodiment of the present invention.

FIG. 6 is a block diagram showing the arrangement of the reproducing system of a digital VTR according to the second embodiment of the present invention. In the second embodiment, the clock signal is generated by using the digital reproduced signal outputted from the A/D converter 5. The arrangement shown in FIG. 6 is similar to that shown in FIG. 3 except that the output signal of the A/D converter 5 is inputted to the clock-signal generating circuit 13.

Figure 7:
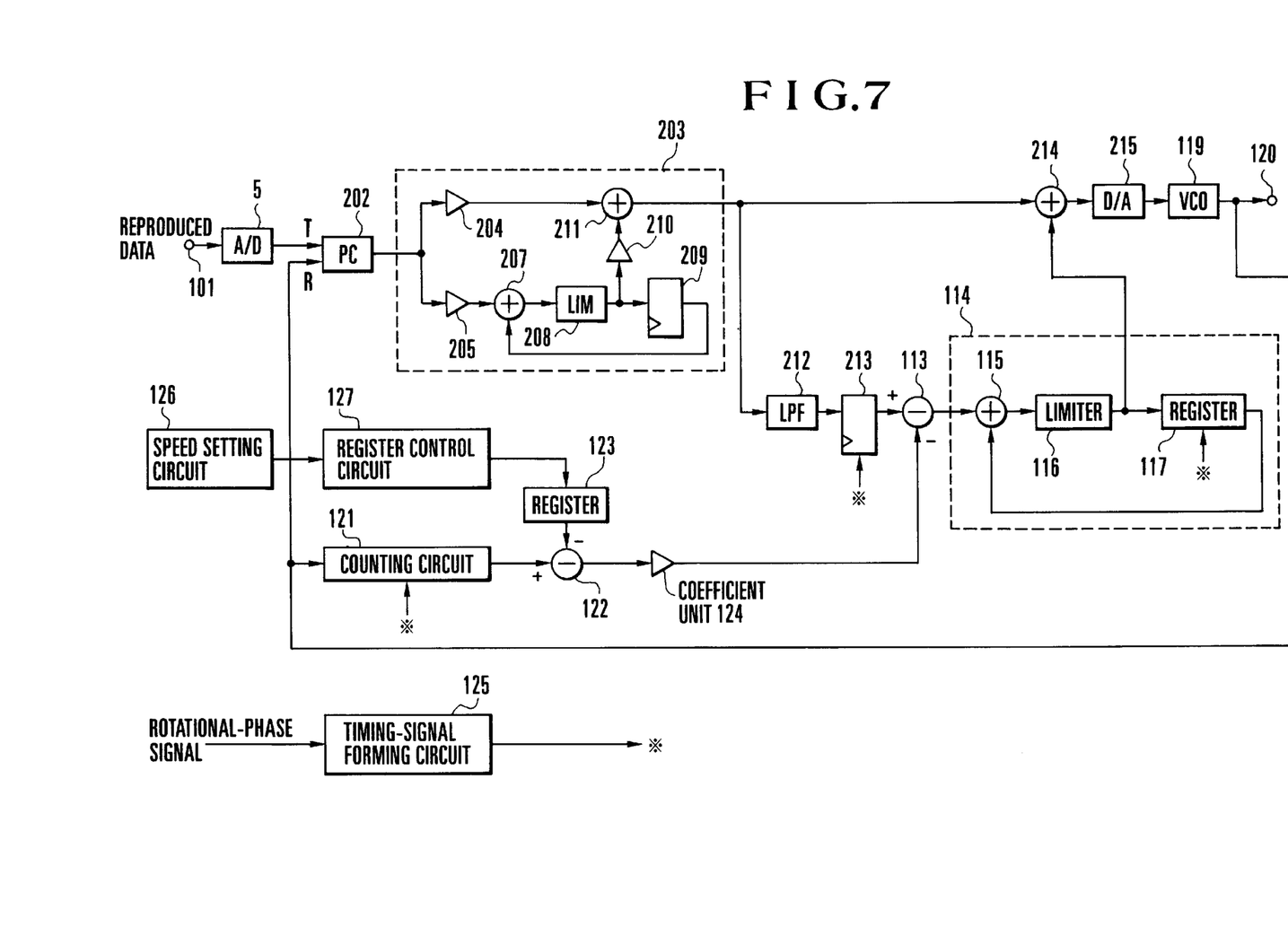
FIG. 7 is a block diagram showing the arrangement of the clock-signal generating circuit shown in FIG. 6.

FIG. 7 is a block diagram showing the arrangement of a clock-signal generating circuit according to the second embodiment of the present invention. In FIG. 7, identical reference numerals are used to denote constituent elements identical to those used in the first embodiment described above.

In the second embodiment, the A/D converter 5 converts a reproduced signal into a digital signal, and the digital signal is inputted to a digital phase comparing circuit 202. The digital phase comparing circuit 202 outputs to a loop filter 203 a signal having a digital value corresponding to the phase difference between the digital signal outputted from the A/D converter 5 and the output of the VCO 119.

The loop filter 203 is made up of a coefficient unit 204, a coefficient unit 205, an adder 207, a limiter 208, a register 209, a coefficient unit 210 and an adder 211. The loop filter 203 performs a function similar to that of the loop filter 103 shown in FIG. 4, though the loop filter 203 is of a digital type and the loop filter 103 is of an analog type.

The output of the loop filter 203 is applied to a digital adder 214 and an LPF 212.

The output of the digital adder 214 is converted into an analog signal by a D/A converter 215, and the analog signal is outputted to the VCO 119. In the second embodiment, the clock signal outputted from the output terminal 120 is used as an operation clock signal for the A/D converter 5 and the D/A converter 215.

The LPF 212 averages the output of the loop filter 203 and outputs the result to a register 213. The register 213 operates in accordance with the clock signal of Ttr shown in FIG. 5, similarly to the A/D converter 112 described above. For this reason, the LPF 212 is used as a pre-filter for sampling to be performed by the register 213. The output of the register 213 is applied to the positive input terminal of the subtracter 113.

The counting circuit 121 counts the output of the VCO 119 in a manner similar to that described above in connection with the first embodiment, and the digital subtracter 122 subtracts the output of the register 123 from the count value of the counting circuit 121. The output of the digital subtracter 122 is applied to the coefficient unit 124, and the output of the coefficient unit 124 is applied to the negative input terminal of the subtracter 113.

The subsequent operation is similar to that of the first embodiment described previously.

As is apparent from the above description, according to the second embodiment, since the phase comparing circuit and the loop filter are digitized, almost all circuits are digitized, whereby it is possible to improve the aging characteristics, stability and maintainability, etc., of the clock-signal generating circuit.

A third embodiment of the present invention will be described below in which a microcomputer executes in accordance with a program the above-described operation performed with the clock signal of Ttr.

Figure 8:
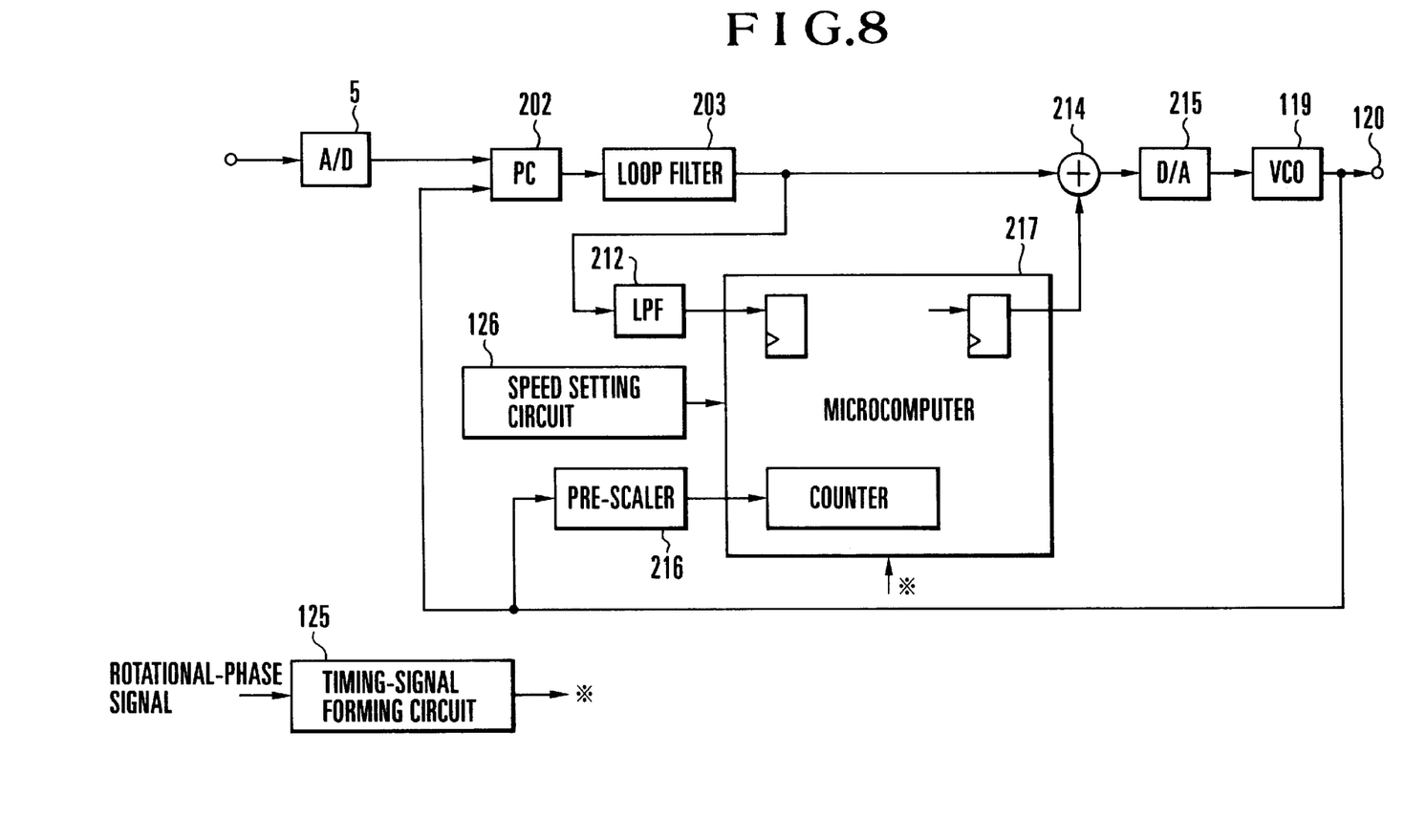
FIG. 8 is a block diagram of a third embodiment of the present invention, showing another arrangement of the clock-signal generating circuit shown in FIG. 6.

FIG. 8 is a block diagram showing the arrangement of a clock-signal generating circuit according to the third embodiment of the present invention.

In the clock-signal generating circuit shown in FIG. 8, the output of the LPF 212 is applied to an input port of a microcomputer 217, and the output of the VCO 119 is frequency-divided by a pre-scaler 216 and applied to a built-in counter incorporated in the microcomputer 217. Although this counter may be externally attached, the use of the built-in counter can reduce the required number of constituent components.

Figure 9:
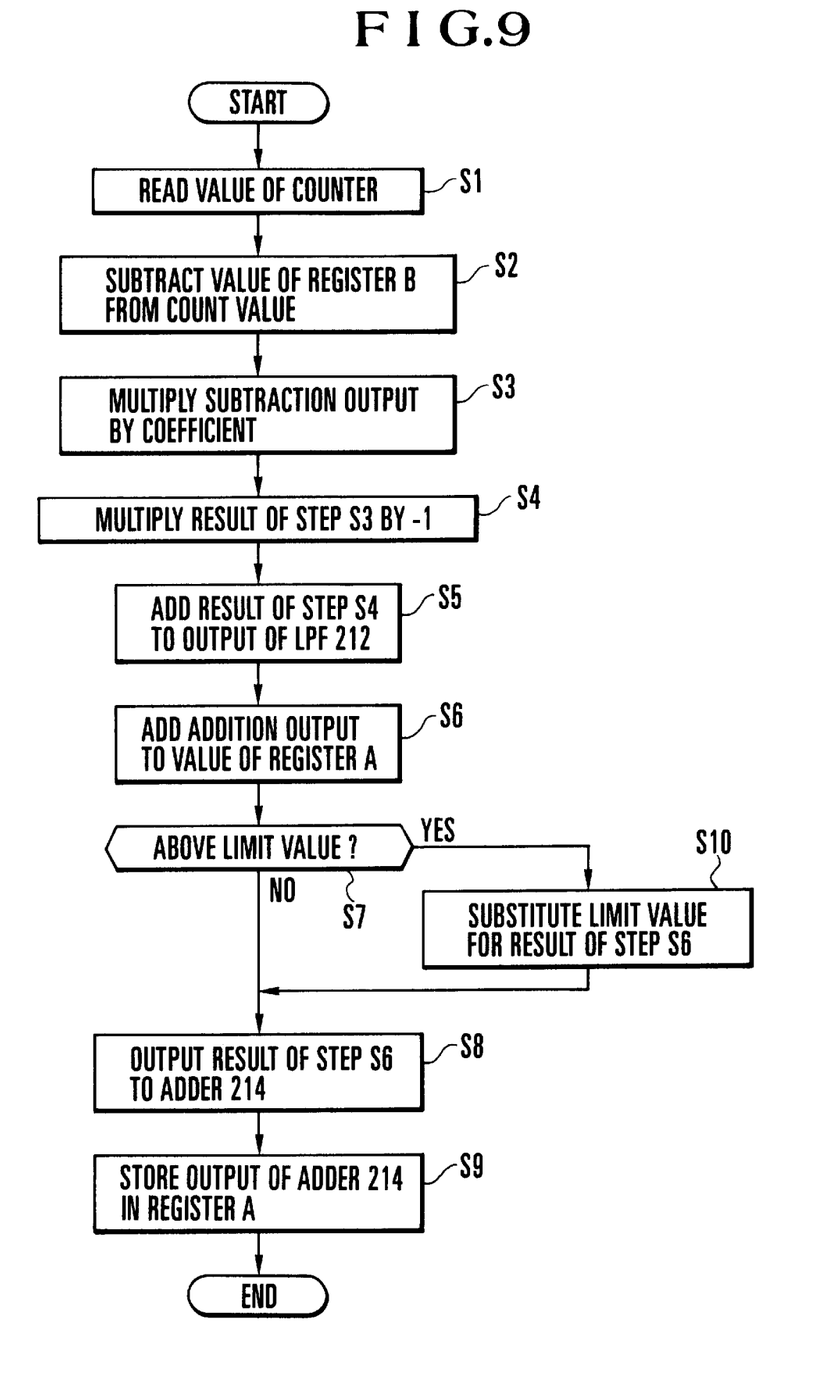
FIG. 9 is a flowchart aiding in explaining the operation of the microcomputer provided in the apparatus shown in FIG. 8.

The operation of the microcomputer 217 will be described below with reference to the flowchart of FIG. 9. Incidentally, it is assumed that the register B shown in FIG. 9 has a function similar to that of the register 123 shown in FIG. 7, while the register A shown in FIG. 9 has a function similar to that of the register 117 shown in FIG. 7.

First of all, if a signal Ttr is inputted from the timing-signal generating circuit 125 at the timing of a break in an envelope, the operation of the microcomputer 217 starts with the input of this signal Ttr. If the signal Ttr is inputted, the microcomputer 217 reads the value of the counter (Step S1) and subtracts the value of the register B from the count value (Step S2). Then, the result obtained in Step S2 is multiplied by a coefficient corresponding to the coefficient unit 124 shown in FIG. 7 (Step S3). After the result obtained in Step S3 is multiplied by −1 (Step S4), the signal outputted from the LPF 212 at the timing of the signal Ttr is added to the result obtained in Step S4 (Step S5).

The value obtained in Step S5 is added to the value of the register A (Step S6). If the addition result exceeds a limit value, the limit value is substituted for the addition result, and is stored in the register A and is also outputted to the adder 214 (Steps S7, S10, S8 and S9).

If the addition result does not exceed the limit value, the value of the addition result is stored in the register A and is also outputted to the adder 214 (Steps S7, S8 and S9).

According to the third embodiment described above, since the microcomputer performs a compensation for the deviation of the output voltage of the loop filter 203 due to a phase error occurring during the time period Ttr, the required number of constituent components can be reduced to a further extent.

The above-described operation of compensating for the deviation of the input voltage of the VCO 119 due to a phase error occurring the time period Ttr is performed at an operating speed as slow as 300 Hz. Accordingly, if an arrangement is adopted in which such operation is performed during an idle time period of another operation of the microcomputer, it is not necessary to substantially increase the required number of constituent components.

Although the above-described embodiments use a digital or analog phase comparator for detecting the phase error between a reproduced signal and the output of a VCO, it is possible to adopt any other means for detecting the phase error between a reproduced signal and the output of a VCO.

Although in the above description of each of the embodiments reference has been made to the case in which the present invention is applied to a digital VTR, the present invention is not limited to such a case. The present invention can be applied to systems for transmission, recording and reproduction of digital signals, such as optical disks or communication systems using radio waves or light. In any case, it is possible to achieve similar effects and advantages.

Each of the aforesaid embodiments has been described with reference to an arrangement which uses one rotary magnetic head to reproduce a digital signal. However, the present invention can be applied to another arrangement in which two magnetic heads are mounted on a rotary drum with a phase difference of 180° so as to alternately trace a magnetic tape to reproduce a digital signal.

In this arrangement, the digital signal which is alternately reproduced is alternately supplied to the clock-signal generating circuit 13.

Figure 10:
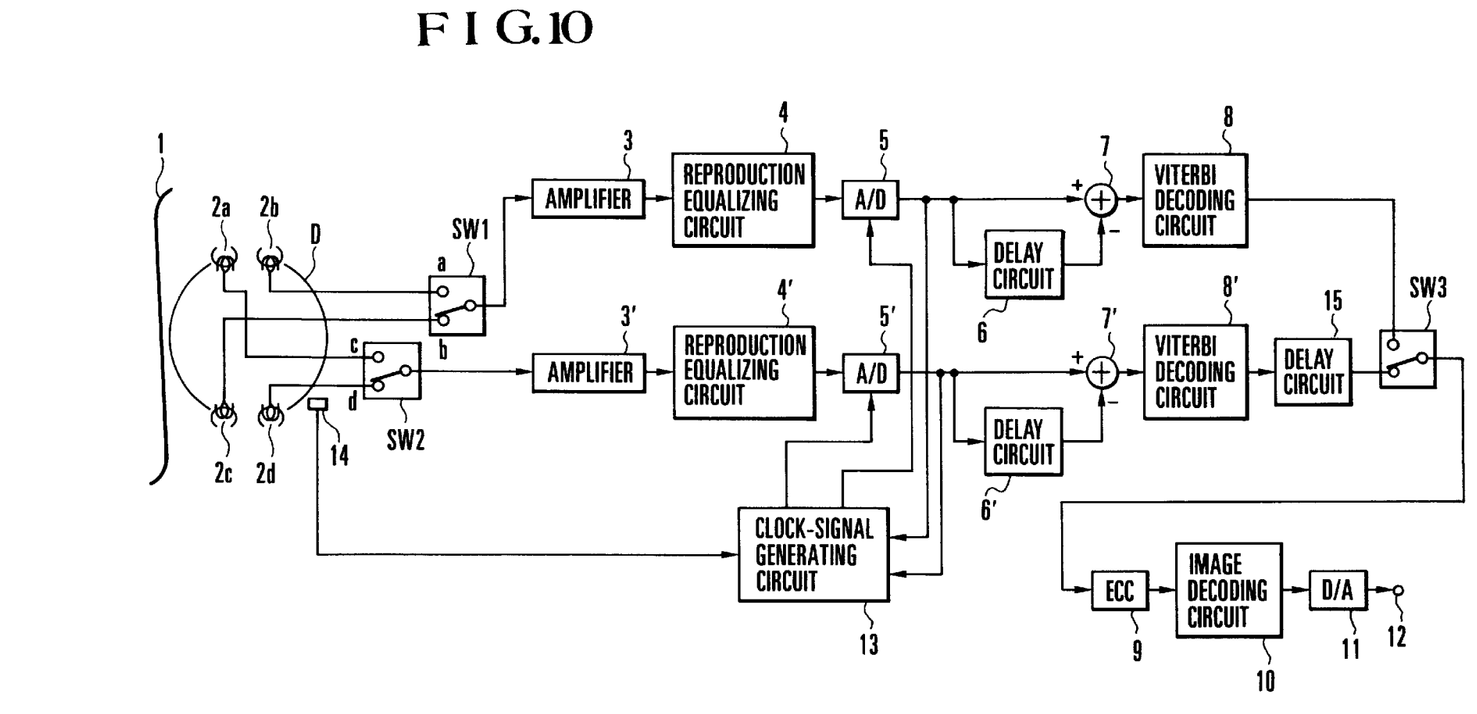
FIG. 10 is a block diagram showing the arrangement of a digital VTR according to a fourth embodiment of the present invention.
Figure 11:
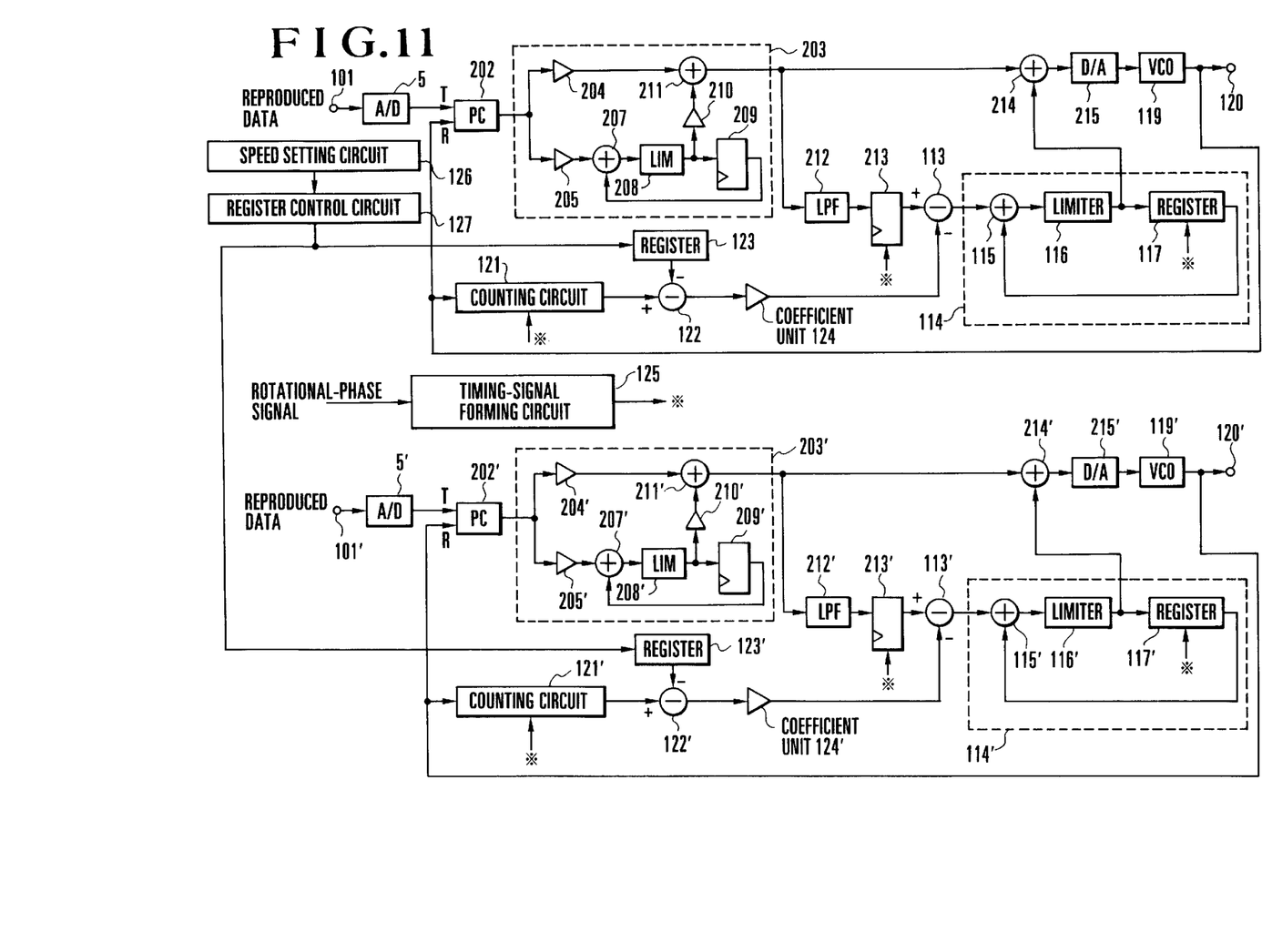
FIG. 11 is a block diagram showing the arrangement of the clock-signal generating circuit shown in FIG. 10.

The present invention can also be applied to a digital VTR having another arrangement, such as that shown in FIG. 10, in which two or more magnetic heads are disposed close to each other so that these plurality of magnetic heads can simultaneously trace a magnetic tape to record or reproduce a digital signal. In such a digital VTR, two systems each having the arrangement shown in FIG. 7 by way of example may be provided for the respective magnetic heads, and a clock-signal generating circuit may be constructed as shown in FIG. 11.

FIG. 10 is a block diagram showing the arrangement of a digital VTR according to a fourth embodiment of the present invention. In the arrangement shown in FIG. 10, two pairs of magnetic heads, which are disposed close to each other, are spaced apart from each other through an angle of 180°.

Referring to FIG. 10, a rotary drum D is provided with magnetic heads 2a and 2b each having a different azimuth angle as well as magnetic heads 2c and 2d each having a different azimuth angle. The magnetic heads 2a and 2b as well as the magnetic heads 2c and 2d are arranged to simultaneously trace the magnetic tape 1 to reproduce digital signals in parallel.

The signal reproduced from each of the magnetic heads 2a, 2b, 2c and 2d is supplied to the corresponding one of the amplifier 3 and an amplifier 3' via either of switches SW1 or SW2 which are switched therebetween in synchronism with the rotational-phase signal supplied from the rotational-phase detecting circuit 14. After the input signals have been amplified by the respective amplifiers 3 and 3', the amplifiers 3 and 3' output the amplified signals to the reproduction equalizing circuit 4 and a reproduction equalizing circuit 4', respectively.

The switches SW1 and SW2 are switched in such a manner that they are connected to their respective sides "a" during the trace period of the magnetic heads 2a and 2b and to their respective sides "b" during the trace period of the magnetic heads 2c and 2d.

The reproduction equalizing circuits 4 and 4' apply to the respective reproduced signals equalization processing similar to that performed by the reproduction equalizing circuit 4 shown in FIG. 6, and output the equalized signals to the A/D converter 5 and an A/D converter 5', respectively. The A/D converters 5 and 5' convert the respective input signals into digital signals each consisting of a plurality of bits per sample. The digital signal outputted from the A/D converter 5 is supplied to the clock-signal generating circuit 13, the delay circuit 6 and the subtracter 7, while the digital signal outputted from the A/D converter 5' is supplied to the clock-signal generating circuit 13, a delay circuit 6' and a subtracter 7'.

The delay circuits 6 and 6' delay their input signals by the period of two samples and output the delayed signals to the respective subtracters 7 and 7'. The subtracters 7 and 7' respectively subtract the outputs of the delay circuits 6 and 6' from the outputs of the A/D converters 5 and 5'.

The signal outputted from the subtracter 7 is restored to a two-level signal consisting of one bit per sample by the Viterbi decoding circuit 8, and the two-level signal is outputted to the ECC circuit 9 through a switch SW3.

The signal outputted from the subtracter 7' is restored by a Viterbi decoding circuit 8' in a similar manner, and the two-level signal is delayed by a delay circuit 15 having the amount of delay corresponding to the period of one track. The signal delayed by the delay circuit 15 is outputted to the error correcting circuit 9 through the switch SW3.

The subsequent operation is similar to that described previously with reference to FIG. 6.

FIG. 11 is a block diagram showing the arrangement of the clock-signal generating circuit 13 shown in FIG. 10. The signals reproduced in parallel by the magnetic heads 2a and 2b shown in FIG. 10 are respectively applied to the input terminals 101 and 101' shown in FIG. 10, and clock signals are generated in the respective circuit systems in the above-described manner.

As is apparent from the above description, in each of the above-described embodiments, the tendency of the output of a loop filter is detected, the detected tendency is added to the output of the loop filter and the addition result is inputted to voltage controlled oscillation means. Accordingly, it is possible to eliminate the deviation of the output voltage of the loop filter due to a phase error occurring between the input signal and the output of the voltage controlled oscillation means, whereby it is possible to hold the PLL in the center of the lock range thereof at all times.

Accordingly, the PLL can follow variations in the oscillation frequency of the voltage controlled oscillation means and variations in the reproduced signal at all times, whereby it is possible to stably generate a clock signal.

In addition, to generate a signal phase-synchronized with the input signal, the output clock signal of the voltage controlled oscillation means is counted, a predetermined value relative to the oscillation frequency is subtracted from the count value, a signal obtained by integrating the subtraction output is added to the output of the loop filter, and the addition result is inputted to the voltage controlled oscillation means. Accordingly, it is possible to detect the oscillation frequency error of the voltage controlled oscillation means by means of a simple arrangement and construction. In addition, it is possible to stably hold the oscillation frequency of the voltage controlled oscillation means without being affected by a temperature variation, aging or the like.

In addition, it is possible to easily construct the reproducing apparatus of a digital circuit, and it is not necessary to use an analog constituent component, such as an FPC or an oscillator for generating a reference signal.

In addition, since the reproducing apparatus is constructed of a digital circuit, it is possible to stabilize the performance of the apparatus and improve the maintainability thereof.

The signal corresponding to the oscillation frequency error of the voltage controlled oscillation means is subtracted from the output of the loop filter, the signal obtained by integrating the subtraction output is added to the output of the loop filter, and the addition result is inputted to the voltage controlled oscillation means. Accordingly, it is possible to hold the PLL in the center of the lock range thereof at all times, and it is also possible to detect the oscillation frequency error of the voltage controlled oscillation means by means of a simple arrangement and construction. In addition, it is possible to stably hold the oscillation frequency of the voltage controlled oscillation means.

What is claimed is:

1. An apparatus for generating a clock signal phase-synchronized with an input signal which has a phase variation, comprising:

phase-difference detecting means for detecting a phase difference between the input signal and the clock signal;

averaging means for periodically averaging an output of said phase-difference detecting means and periodically outputting a signal indicative of the average of the output of said phase-difference detecting means;

adding means for receiving the periodic output signal of said averaging means and the output of said phase-difference detecting means and for adding together the periodic output signal of said averaging means and the output of said phase-difference detecting means; and oscillation means for receiving an output of said adding means and outputting as the clock signal a signal having a frequency corresponding to the output of said adding means.

2. An apparatus according to claim 1, further comprising a loop filter into which the output of said phase-difference detecting means is inputted, said averaging means averaging an output of said loop filter and said adding means adding together the output of said averaging means and the output of said loop filter.

3. An apparatus according to claim 1, wherein said averaging means includes a low-pass filter for suppressing a high-frequency component of said phase-difference detecting means and integrating an output of said low-pass filter.

4. An apparatus according to claim 1, further comprising reproducing means for reproducing a signal from a recording medium and for outputting the reproduced signal as the input signal, said phase difference detecting means detecting a phase difference between the clock signal and the reproduced signal.

5. An apparatus according to claim 4, further comprising converting means for sampling the reproduced signal in response to the clock signal and for converting the reproduced signal into a digital signal represented by a plurality of bits per sample, said phase-difference detecting means detecting said phase-difference between the clock signal and the digital signal output from said converting means.

6. An apparatus according to claim 1, further comprising means for converting the output of said adding means into an analog signal and outputting the analog signal to said oscillation means, the output of said adding means being a digital signal.

7. An apparatus according to claim 1, wherein said averaging means and said adding means are formed by a digital circuit.

8. An apparatus according to claim 1, wherein said averaging means, and said adding means are formed by a microcomputer.

9. An apparatus according to claim 1, further comprising reproducing means for reproducing a signal from a recording medium and outputting the reproduced signal as the input signal, said averaging means being operative at a period relative to the reproducing operation of said reproducing means.

10. An apparatus according to claim 9, wherein said reproducing means generates a periodic signal according to the reproduction operation, said averaging means being operative according to the periodic signal.

11. An apparatus according to claim 10, wherein said reproducing means comprises a rotary head and the periodic signal has a period corresponding to a rotation period of said rotary head.

12. An apparatus according to claim 1, wherein said averaging means comprises register means for holding the signals indicative of the average of the output of said phase-difference detecting means, said averaging means periodically updating the signals held in said register means.

13. An apparatus according to claim 1, further comprising frequency-difference detecting means for detecting a frequency difference between a frequency of the clock signal and a target frequency, said averaging means periodically averaging an output of said frequency-difference detecting means.

14. An apparatus according to claim 13, further comprising subtracting means for receiving the output of said phase-difference detecting means and the output of said frequency-difference detecting means and for obtaining a difference between the output of said phase-difference detecting means and the output of said frequency-difference detecting means, said averaging means periodically averaging the output of said subtracting means.

15. An apparatus according to claim 14, wherein said frequency-difference detecting means comprises counting means for counting the clock signal and for periodically outputting a counted result, register means for holding data having a value corresponding to the target frequency, and second subtracting means for obtaining a difference of the counted result of said counting means and the data held by said register means, said frequency-difference detecting means outputting the output of said second subtracting means to said subtracting means.

16. An apparatus according to claim 15, wherein said frequency-difference detecting means comprises changing means for changing the value of the data held by said register means.

17. A reproducing method which is applicable to an apparatus which is arranged to reproduce a signal from a recording medium and includes a PLL formed by an oscillator, a phase-difference detector for detecting a phase difference between an output clock signal of said oscillator and the reproduced signal, and a loop filter for receiving an output of said phase-difference detector, said reproducing method generating a clock signal phase-synchronized with the reproduced signal, said reproducing method comprising the steps of:

integrating an output of said loop filter;

adding an integral result to the output of said loop filter; and inputting an addition result to said oscillator.

18. A reproducing method which is applicable to an apparatus which is arranged to reproduce a signal having a phase variation and includes a PLL formed by an oscillator, a phase-difference detector for detecting a phase difference between an output clock signal of said oscillator and the reproduced signal, and a loop filter for receiving an output of said phase-difference detector, said reproducing method generating a clock signal phase-synchronized with the reproduced signal, said reproducing method comprising the steps of:

an integrating step of periodically integrating an output of said loop filter;

an adding step of periodically adding an integral result of said integrating step to the output of said loop filter; and an inputting step of inputting an addition result of said adding step to said oscillator.

19. A method according to claim 17, wherein said integrating step is performed by using a microcomputer.

20. A method according to claim 17, wherein said reproduced signal is sampled by using said clock signal and a corresponding sampled signal is converted into a digital signal represented by a plurality of bits per sample.

21. A method according to claim 20, wherein said phase-difference detecting means detects a phase difference between said output clock signal of said oscillator and said digital signal obtained through said conversion.

22. A PLL circuit for generating a clock signal phase synchronized with an input signal which has a phase variation, comprising:

a phase detector for detecting a phase difference between an input signal and the clock signal, and outputting a phase detection signal indicative of the phase difference;

a loop filter for receiving the phase detection signal;

an integrating circuit for periodically integrating an output of the loop filter;

an adding circuit for adding together the output of the loop filter and a periodic integration output of the integrating circuit; and an oscillator for receiving an added result of said adding circuit and outputting the clock signal having a frequency corresponding to the added result.

23. A reproducing apparatus, comprising:

reproducing means for reproducing a signal from a recording medium, the reproduced signal having a phase variation;

timing signal generating means for periodically generating a timing signal according to a reproducing operation of said reproducing means;

phase-difference detecting means for detecting a phase difference between the reproduced signal and clock signal;

integrating means for integrating an output of said phase-difference detecting means and for outputting a signal indicative of the integration result of the output of said phase-difference detecting means, said integrating means operating according to the periodic timing signal;

adding means for receiving the output signal of said integrating means and the output of said phase-difference detecting means and for adding the output signal of said integrating means and the output of said phase-difference detecting means; and oscillation means for receiving an output of said adding means and outputting as the clock signal a signal having a frequency corresponding to the output of said adding means.

24. An apparatus according to claim 23, further comprising frequency-difference detecting means for detecting a frequency difference between a frequency of the clock signal and a target frequency, said integrating means integrating an output of said frequency-difference detecting means according to the periodic timing signal.

25. An apparatus according to claim 24, further comprising subtracting means for receiving the output of said phase-difference detecting means and the output of said frequency-difference detecting means and for obtaining a difference between the output of said phase-difference detecting means and the output of said frequency-difference detecting means, said integrating means integrating the output of said subtracting means according to the periodic timing signal.

26. An apparatus according to claim 23, further comprising digital data detecting means for detecting digital data from the reproduced signal according to the clock signal.

* * * * *

UNITED STATES PATENT AND TRADEMARK OFFICE
CERTIFICATE OF CORRECTION

PATENT NO.   : 6,097,560
DATED        : August 1, 2000
INVENTOR(S)  : Yasuyuki Tanaka et al.

It is certified that error appears in the above-identified patent and that said Letters Patent is hereby corrected as shown below:

Column 4,
Line 14, delete "digital-signal" and insert -- digital signal --.
Line 37, delete "Likelihood" and insert -- likelihood --.
Line 44, delete "low-frequency-characteristics" and insert -- low-frequency characteristics --.
Line 44, delete "claim 17" and insert -- claim 18 --.
Line 47, delete "claim 17" and insert -- claim 18 --.

Signed and Sealed this

Eighteenth Day of December, 2001

*Attest:*

JAMES E. ROGAN
*Attesting Officer*    Director of the United States Patent and Trademark Office